(12) United States Patent
Kang

(10) Patent No.: US 8,395,171 B2
(45) Date of Patent: Mar. 12, 2013

(54) LIGHT EMITTING DEVICE AND LIGHT EMITTING DEVICE PACKAGE

(75) Inventor: Dong Hun Kang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 233 days.

(21) Appl. No.: 12/913,351

(22) Filed: Oct. 27, 2010

(65) Prior Publication Data

US 2011/0095322 A1   Apr. 28, 2011

(30) Foreign Application Priority Data

Oct. 28, 2009   (KR) .................. 10-2009-0102805

(51) Int. Cl.
   *H01L 33/00*   (2010.01)
(52) U.S. Cl. ............ 257/98; 257/99; 257/E33.068
(58) Field of Classification Search ............ 257/E33.068
    See application file for complete search history.

(56) References Cited

U.S. PATENT DOCUMENTS

| 2004/0119082 A1 | 6/2004 | Sugawara |
| 2005/0173718 A1 | 8/2005 | Shin |
| 2008/0164484 A1 * | 7/2008 | Lee ................................. 257/89 |
| 2009/0026478 A1 * | 1/2009 | Yoon et al. ..................... 257/98 |
| 2009/0261370 A1 | 10/2009 | Jeong |

FOREIGN PATENT DOCUMENTS

| JP | 2005-223329 A | 8/2005 |
| JP | 2007-95744 A | 4/2007 |
| KR | 10-2005-0122600 A | 12/2005 |
| KR | 10-2008-0001245 A | 1/2008 |
| KR | 10-2008-0064060 A | 7/2008 |
| KR | 10-2009-0046602 A | 5/2009 |

* cited by examiner

*Primary Examiner* — Daniel Whalen
(74) *Attorney, Agent, or Firm* — Birch, Stewart, Kolasch & Birch, LLP

(57) ABSTRACT

Provided are a light emitting device and a light emitting device package. The light emitting device comprises a light emitting structure comprising a first conductive type semiconductor layer, an active layer on the first conductive type semiconductor layer, and a second conductive type semiconductor layer on the active layer; a first electrode on the first conductive type semiconductor layer, the first electrode being electrically connected to the first conductive type semiconductor layer; a plurality of reflective islands on the second conductive type semiconductor layer; a second electrode on the second conductive type semiconductor layer and the plurality of reflective islands, the second electrode being electrically connected to the second conductive type semiconductor layer; and a conductive support member on the second electrode.

20 Claims, 7 Drawing Sheets

(a)    (b)

LIGHT EMITTING DEVICE AND LIGHT EMITTING DEVICE PACKAGE

CROSS-REFERENCE TO RELATED APPLICATIONS

The present application claims priority under 35 U.S.C. §119(a) of Korean Patent Application No. 10-2009-0102805 filed on Oct. 28, 2010, which is hereby incorporated by reference in its entirety.

BACKGROUND

Embodiments relate to a light emitting device and a light emitting device package.

Light emitting diodes (LED) are semiconductor light emitting devices that convert current into light. As brightness of LEDs is gradually increased in recent years, the LEDs are being used as light sources for displays, vehicles, and illuminations. Also, LEDs emitting white light having superior efficiency may be realized by using a fluorescent substance or combining LEDs having various colors.

Brightness of such an LED depends on various conditions such as a light extraction structure, which can effectively extract light to the outside, a semiconductor material used in the LED, a chip size, and a kind of a molding member surrounding the LED.

SUMMARY

Embodiments provide a light emitting device having improved light extraction efficiency and a light emitting device package. Embodiments also provide a light emitting device having a good current spreading effect and a light emitting device package. Embodiments also provide a light emitting device in which a light emitting structure and a second electrode are firmly fixed and coupled to each other, and a light emitting device package.

In one embodiment, a light emitting device comprises: a light emitting structure comprising a first conductive type semiconductor layer, an active layer on the first conductive type semiconductor layer, and a second conductive type semiconductor layer on the active layer; a first electrode on the first conductive type semiconductor layer, the first electrode being electrically connected to the first conductive type semiconductor layer; a plurality of reflective islands on the second conductive type semiconductor layer; a second electrode on the second conductive type semiconductor layer and the plurality of reflective islands, the second electrode being electrically connected to the second conductive type semiconductor layer; and a conductive support member on the second electrode.

In another embodiment, a light emitting device package comprises: a body part; first and second electrode layers on the body part; and a light emitting device on the body part, the light emitting device being electrically connected to the first and second electrode layers, wherein the light emitting device comprises: a light emitting structure comprising a first conductive type semiconductor layer, an active layer on the first conductive type semiconductor layer, and a second conductive type semiconductor layer on the active layer; a first electrode on the first conductive type semiconductor layer, the first electrode being electrically connected to the first conductive type semiconductor layer; a plurality of reflective islands on the second conductive type semiconductor layer; a second electrode on the second conductive type semiconductor layer and the plurality of reflective islands, the second electrode being electrically connected to the second conductive type semiconductor layer; and a conductive support member on the second electrode.

The details of one or more embodiments are set forth in the accompanying drawings and the description below. Other features will be apparent from the description and drawings, and from the claims.

DETAILED DESCRIPTION OF THE EMBODIMENTS

Figure 1:
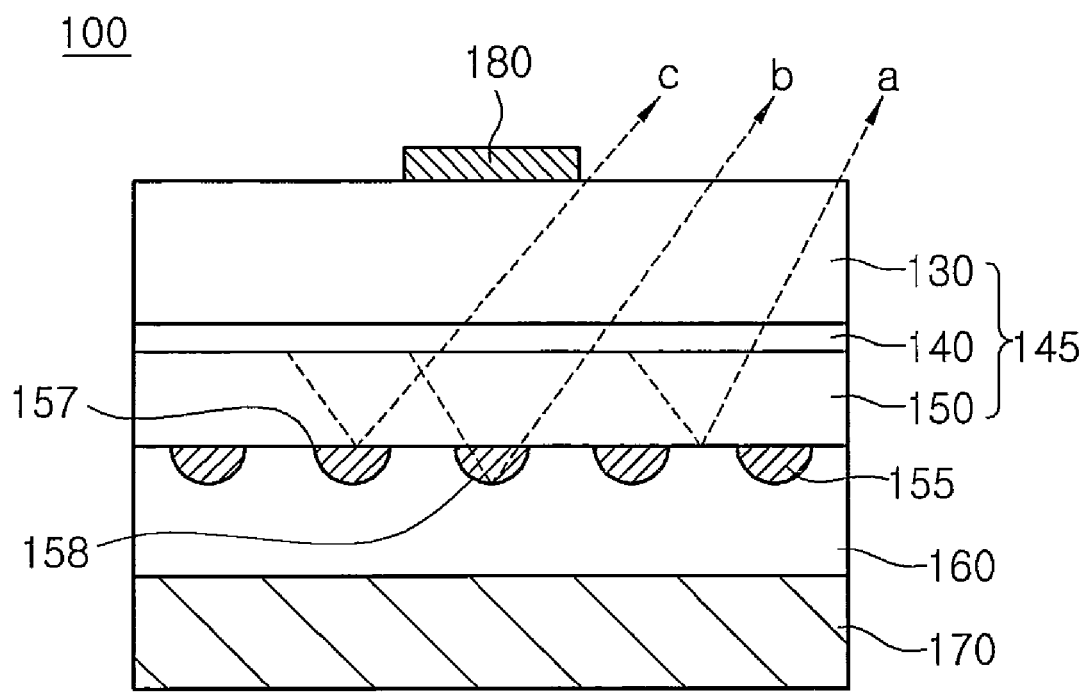
FIG. 1 is a sectional view of a light emitting device according to an embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device according to an embodiment and a method of manufacturing the same will be described with reference to the accompanying drawings.

FIG. 1 is a sectional view of a light emitting device 100 according to an embodiment.

Referring to FIG. 1, the light emitting device 100 includes a light emitting structure 145, a plurality of reflective islands 155, a second electrode 160, a conductive support member 170, and a first electrode 180.

The light emitting structure 145 is a structure that emits light. The light emitting structure 145 may include a first conductive type semiconductor layer 130, an active layer 140, and a second conductive type semiconductor layer 150.

For example, the first conductive type semiconductor layer 130 may include an n-type semiconductor layer. The n-type semiconductor layer may be formed of a semiconductor material having a compositional formula of $In_xAl_yGa_{1-x-y}N$ ($0 \leq x \leq 1, 0 \leq y \leq 1, 0 \leq x+y \leq 1$), e.g., at least one of GaN, InN, AlN, InGaN, AlGaN, InAlGaN, and AlInN. Here, the n-type semiconductor layer is doped with an n-type dopant such as Si, Ge, and Sn.

An undoped semiconductor layer, e.g., an undoped GaN layer may be disposed on the first conductive type semiconductor layer 130.

Also, the first electrode 180 may be disposed on the first conductive type semiconductor layer 130. The first electrode 180 provides a power to the light emitting device 100.

The active layer 140 is disposed below the first conductive type semiconductor layer 130. The active layer 140 may have at least one of a single quantum well structure, a multi quantum well (MQW) structure, a quantum wire structure, and a quantum dot structure.

A doped clad layer (not shown) in which an n-type or p-type dopant is doped may be disposed above/below the active layer 40. The clad layer (not shown) may be realized by an AlGaN layer or an InAlGaN layer.

The second conductive type semiconductor layer 150 is disposed on the active layer 140. For example, the second conductive type semiconductor layer 150 may be realized by a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, InGaN, AlN, or InN. Also, the p-type semiconductor layer may be doped with the p-type dopant such as Mg, etc.

The p-type dopant and the n-type dopant may be doped into the first conductive type semiconductor layer 130 and the second conductive type semiconductor layer 150, respectively, but are not limited thereto. Also, although not shown, a third conductive type semiconductor layer (not shown) may be disposed on the second conductive type semiconductor layer 150. Thus, the light emitting device 100 may have one of a pn junction structure, an np junction structure, a pnp junction structure, and an npn junction structure.

Also, the plurality of reflective islands 155 may be disposed on the second conductive type semiconductor layer 150. The plurality of reflective islands 155 may be disposed over the entire region of the second conductive type semiconductor layer 150, and this will be described below with reference to FIG. 7.

Each of the plurality of reflective islands 155 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, InN, AlN, and AlInN. For example, the reflective island 155 may be formed of a metal nitride in which at least one of Al, Ga, and In is nitrified.

Here, the plurality of reflective islands 155 may be formed of a material different from that of the second conductive type semiconductor layer 150, e.g., a material having a refractive index less than that of the second conductive type semiconductor layer 150. For example, when the second conductive type semiconductor layer 150 is formed of GaN, the reflective island 155 may be formed of AlN or AlInN.

Each of the plurality of reflective islands 155 may have a curved shape on the second conductive type semiconductor layer 150. For example, the plurality of reflective islands 155 may have a plurality of convex lens shapes spaced from each other.

Each of the plurality of reflective islands 155 is not limited to a shape thereof. That is, the reflective island 155 may be variously changed in shape according to the manufacturing method of the light emitting device 100.

Each of the plurality of reflective islands 155 may have a diameter ranging from about 10 nm to about 1,000 nm. Also, the plurality of reflective islands 155 may be different in size or shape from each other. That is, the plurality of reflective islands 155 may have diameters or/and a curvatures different from each other.

The second electrode 160 may be disposed on the second conductive type semiconductor layer 150 and the plurality of reflective islands 155. The second electrode 160 may be formed of at least one of silver (Ag), an alloy containing Ag, aluminum (Al), an alloy containing Al, platinum (Pt), and an alloy containing Pt, which has a reflective index.

The second electrode 160 may be firmly coupled and fixed to the second conductive type semiconductor layer 150 by the plurality of reflective islands 155.

An ohmic contact layer may be disposed between the second electrode 160 and the light emitting structure, i.e., the second conductive type semiconductor layer 150.

Hereinafter, actions and effects of the second electrode 160 and the plurality of reflective islands 155 will be described with reference to FIG. 1.

The reflective island 155 may protrude into the second electrode 160 toward the conductive support member 170. The second electrode 160 may be formed of a metal having a high reflective index to function as a reflective member. Thus, since the reflective island 155 protrudes toward the inside of the second electrode 160, reflection may also occur on an interface of the reflective island 155. For convenience of description, light emitted from the light emitting device 100 will be described as being divided into first light (a), second light (b), and third light (c).

<First light (a)> The second electrode 160 reflects the first light (a) incident from the active layer 140 to an emitting light of the light emitting device 100.

<Second light (b)> The second light (b) incident from the active layer 140 to the plurality of reflective islands 155 is totally reflected by the plurality of reflective islands 155 and emitted through the emitting surface of the light emitting device 100.

In detail, since each of the plurality of reflective islands 155 has a refractive index less than that of the second conductive type semiconductor layer 150, light incident into the plurality of reflective islands 155 at an angle greater than a critical angle is totally reflected by a first interface 157 between the plurality of reflective islands 155 and the second conductive type semiconductor layer 150 and emitted through the emitting surface of the light emitting device 100.

<Third light (c)> The third light (c) incident from the active layer 140 to the plurality of reflective islands 155 is reflected by a second interface 158 between the plurality of reflective islands 155 and the second electrode 160 and emitted through the emitting surface of the light emitting device 100.

Although a light path of the third light (c) is changed by the first interface 157, the third light (c) is not totally reflected. The third light (c) may transmit the plurality of reflective islands 155, and then be reflected by the second interface 158.

Thus, since the plurality of reflective islands 155 is provided, the light including the first, second, and third light (a, b, and c) may be emitted from the light emitting device 100 through various paths. Therefore, light extraction efficiency of the light emitting device 100 may be improved.

The conductive support member 170 may be disposed on the second electrode 160. The conductive support member 160 may be formed of at least one of Ti, Cr, Ni, Al, Pt, Au, W, Cu, and Mo, or may include a semiconductor substrate in which impurities are injected. The conductive support member 160 and the first electrode 480 provide power to the light emitting device 100.

Here, the plurality of reflective islands 155 may provide a current spreading effect in which current supplied from the conductive support member 170 is uniformly spread into the entire region of the light emitting structure 145.

Since the plurality of reflective islands 155 may have resistance and disposed over the entire region of the second conductive type semiconductor layer 150, the current supplied from the conductive support member 170 may be uniformly spread over the entire region, but do not concentrately flow into a specific region of the light emitting structure 145.

Also, the plurality of reflective islands 155 increases a contact area with the second electrode 170 to allow the second electrode 170 and the light emitting structure 145 to be firmly fixed and coupled to each other.

A method of manufacturing the light emitting device 100 will be described in detail with reference to FIGS. 1 to 5.

Figure 2:
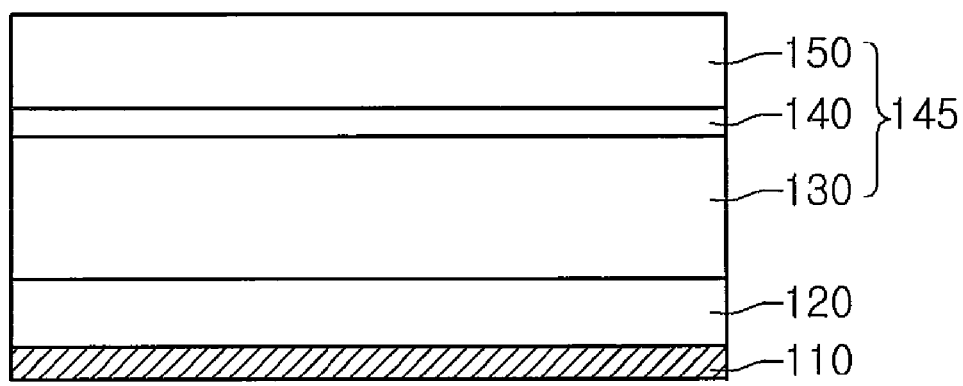
FIGS. 2 to 5 are sectional views illustrating a process of manufacturing a light emitting device according to an embodiment.

Referring to FIG. 2, an undoped semiconductor layer 120 may be formed on a substrate 110, and a light emitting structure 145 may be formed on the undoped semiconductor layer 120.

The substrate 110 may be selected from the group consisting of sapphire substrate ($Al_2O_3$), GaN, SiC, ZnO, Si, GaP, Inp, and GaAs.

For example, the undoped semiconductor layer 120 may be an undoped GaN layer.

Here, a buffer layer (not shown) may be inserted between the substrate 110 and the undoped semiconductor layer 120. The buffer layer (not shown) is a layer for reducing a lattice constant difference between the substrate 110 and the undoped semiconductor layer 120. The buffer layer may be formed of one of GaN, AlN, AlGaN, InGaN, AlInGaN, InN, and AlInN.

The buffer layer (not shown) and the undoped semiconductor layer 120 may be provided as at least one layer or may not be provided.

The light emitting structure 145 may include a first conductive type semiconductor layer 130, an active layer 140 on the first conductive type semiconductor layer 130, and a second conductive type semiconductor layer 150 on the active layer 140.

For example, the first conductive type semiconductor layer 130 may include an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one of InAlGaN, GaN, AlGaN, AlInN, InGaN, AlN, and InN. Here, the n-type semiconductor layer is doped with an n-type dopant such as Si, Ge, and Sn.

The active layer 140 may have at least one of a single quantum well structure, a multi quantum well (MQW) structure, a quantum wire structure, and a quantum dot structure.

A doped clad layer (not shown) in which an n-type or p-type dopant is doped may be disposed above/below the active layer 40. The clad layer (not shown) may be realized by an AlGaN layer or an InAlGaN layer.

For example, the second conductive type semiconductor layer 150 may be realized by a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, InGaN, AlN, AlInN, or InN. Also, the p-type semiconductor layer may be doped with the p-type dopant such as Mg, etc.

The p-type dopant and the n-type dopant may be doped into the first conductive type semiconductor layer 130 and the second conductive type semiconductor layer 150, respectively, but are not limited thereto. Also, although not shown, a third conductive type semiconductor layer (not shown) may be disposed on the second conductive type semiconductor layer 150. Thus, the light emitting device 100 may have one of a pn junction structure, an np junction structure, a pnp junction structure, and an npn junction structure.

The undoped semiconductor layer 120 and the light emitting structure 145 may be formed using a metal organic chemical vapor deposition (MOCVD) process, a chemical vapor deposition (CVD) process, a plasma-enhanced chemical vapor deposition (PECVD0 process, a molecular beam epitaxy (MBE) process, or a hydride vapor phase epitaxy (HVPE) process.

Figure 3:
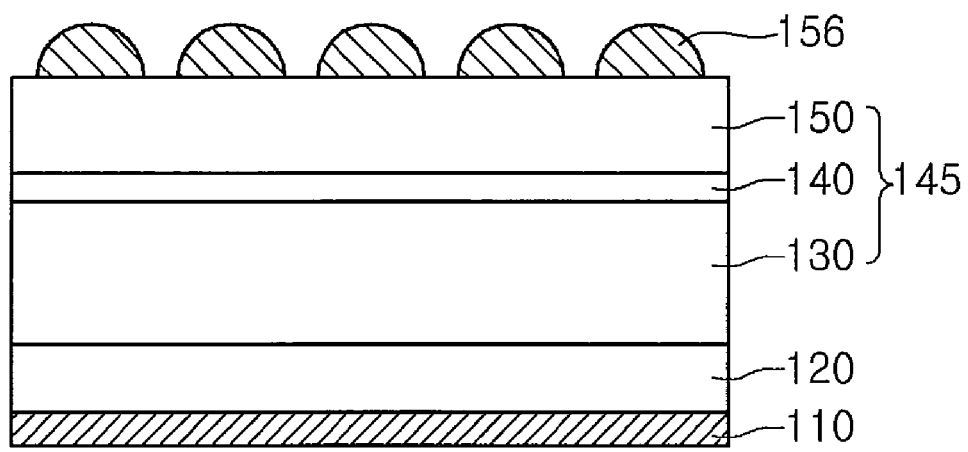

Referring to FIG. 3, a plurality of metal islands 156 may be formed on the second conductive type semiconductor layer 150.

For example, the plurality of metal islands 156 may be formed of at least one metal of Al, Ga, and In.

The plurality of metal islands 156 may be formed at a temperature of about 700° C. to about 900° C. Here, since each of the metals has in a liquid state, the metal may have a convex lens shape by a surface tension thereof as shown in FIG. 3.

Each of the plurality of metal islands 156 may have a size and diameter, which are variously changed according to a formation temperature and time thereof.

Figure 4:
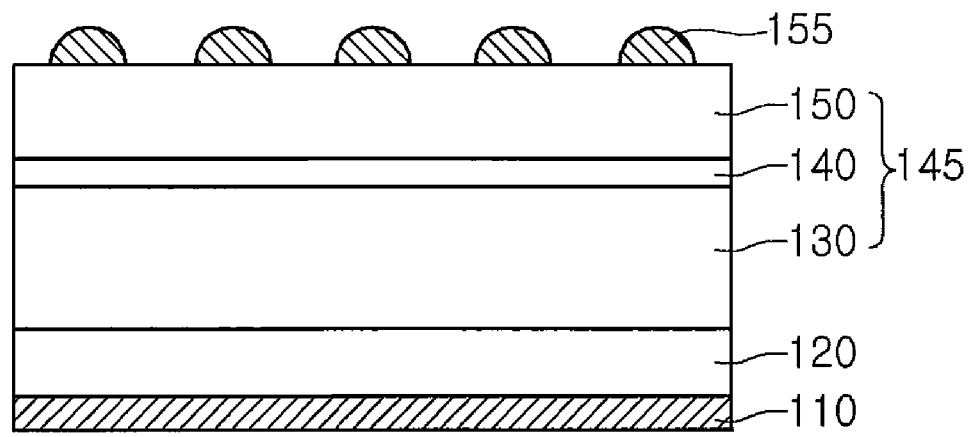

Referring to FIG. 4, the plurality of metal islands 156 may be nitrified to form the plurality of reflective islands 155.

The plurality of reflective islands 155 may be formed over the entire region of the second conductive type semiconductor layer 150.

The plurality of reflective islands 155 having a plurality of convex lens shapes spaced from each other may be formed on the second conductive type semiconductor layer 150. However, each of the plurality of reflective islands 155 is not limited to a shape thereof. For example, the reflective island 155 may be variously changed in shape according to a method of manufacturing the light emitting device 100.

Since the plurality of reflective islands 155 may be formed by nitrifying the plurality of metal islands 156, each of the plurality of reflective islands 155 may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., one of InAlGaN, GaN, AlGaN, InGaN, AlN, InN, and AlInN.

Here, the plurality of reflective islands may be formed of a material different from that of the second conductor type semiconductor layer 150. For example, the plurality of reflective islands may be formed of a material having a refractive index less than that of the second conductive type semiconductor layer 150.

Figure 6:
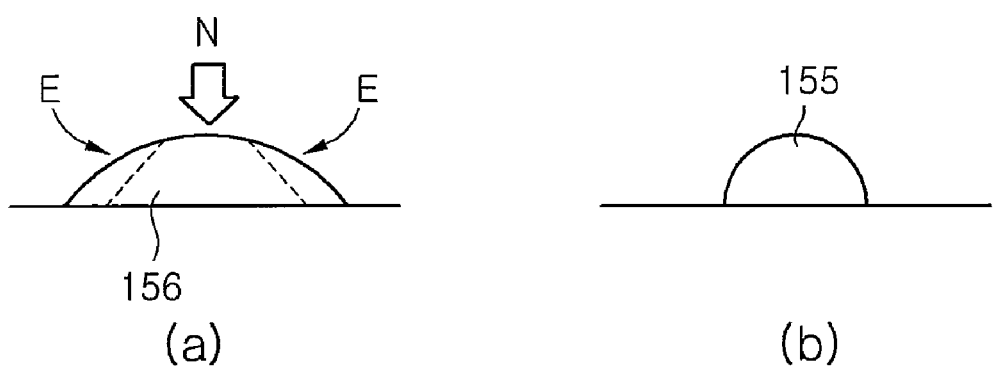
FIG. 6 is a sectional view of a process in which a plurality of metal islands is nitrified to form a plurality of reflective islands.

Since the plurality of metal islands 156 is nitrified (N) at a temperature of about 700° C. to about 900° C., a surface of each of the plurality of metal islands 156 is evaporated in the nitridation (N) process. Thus, the plurality of metal islands 156 may be reduced in size and diameter to form the plurality of reflective islands 155 (See FIG. 6).

Thus, the sizes and diameters of the plurality of reflective islands 156 may be decided by sizes, the nitridation (N) temperature, and the nitridation (N) process time of the plurality of initial metal islands 156. For example, each of the plurality of reflective islands 155 may have a diameter of about 10 nm to about 1,000 nm.

Figure 7:
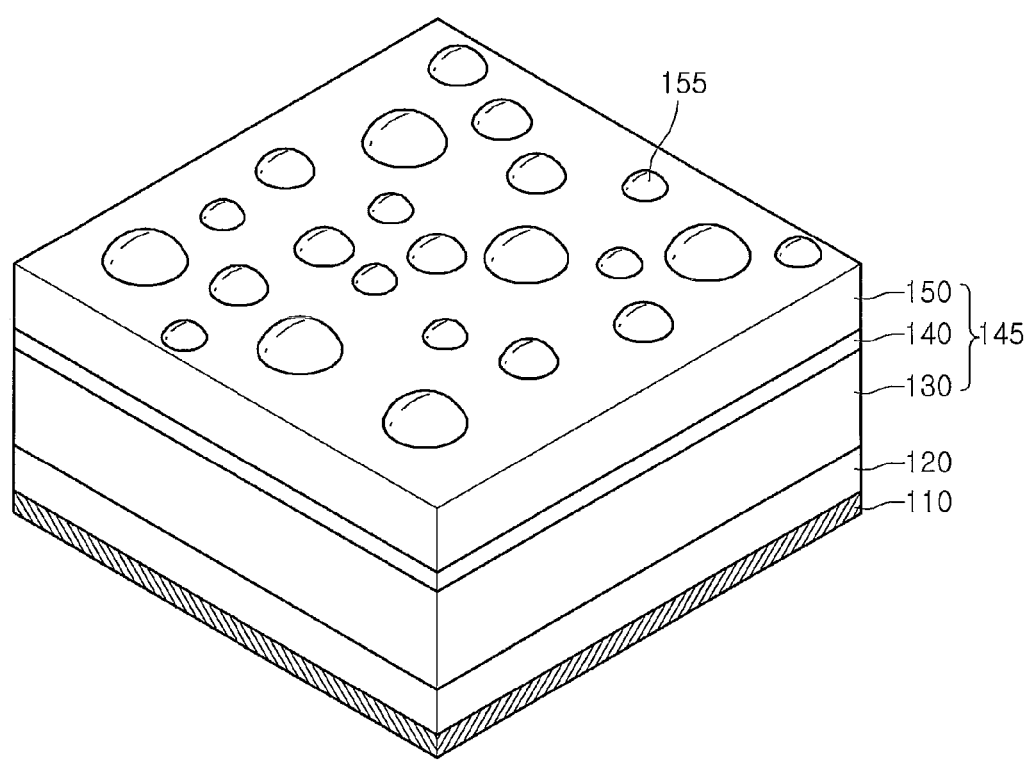
FIG. 7 is a perspective view illustrating an example of the light emitting device including the plurality of reflective islands.

Also, as shown in FIG. 7, the plurality of reflective islands 155 may have sizes, diameters, shapes, which are different from each other, but is not limited thereto. When the plurality of reflective islands 155 has shapes different from each other, the plurality of reflective islands 155 may refract, diffract, reflect, or scatter light incident at various angles to improve light extraction efficiency.

Also, the plurality of reflective islands 155 improves the light extraction efficiency of the light emitting device 100, firmly couples and fixes the second electrode 160 to the second conductive type semiconductor layer 150, and provides a current spreading effect in which current supplied from the conductive support member 170 is uniformly spread into the light emitting structure 145.

Figure 5:
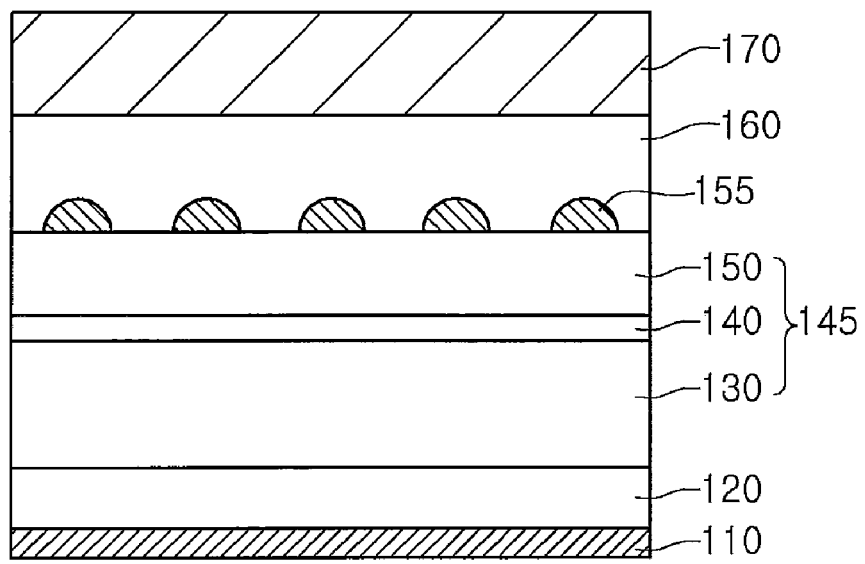

Referring to FIG. 5, the second electrode 160 may be formed on the second conductive type semiconductor layer 150 and the plurality of reflective islands 155. The conductive support member 170 may be formed on the second electrode 160.

The second electrode 160 may be formed of a metal having a high reflective index, e.g., at least one of silver (Ag), an alloy containing Ag, aluminum (Al), an alloy containing Al, platinum (Pt), and an alloy containing Pt, which has a reflective index.

The conductive support member 170 may be disposed on the second electrode 160. The conductive support member 160 may be formed of at least one of Ti, Cr, Ni, Al, Pt, Au, W, Cu, and Mo, or may include a semiconductor substrate in which impurities are injected. The conductive support member 160 and the first electrode 480 provide power to the light emitting device 100.

Sequentially, after the substrate 110 is removed from the light emitting structure 145, the first electrode 180 may be formed on the light emitting structure 145 to provide the light emitting device 100 as shown in FIG. 1. For reference, FIG. 1 illustrates reverse side of FIG. 5. Here, the undoped semiconductor layer 120 and/or the buffer layer (not shown) may be removed. The substrate 110 may be removed by a laser lift off (LLO) process. Also, the undoped semiconductor layer 120 and the buffer layer (not shown) may be removed by an etch process.

Figure 8:
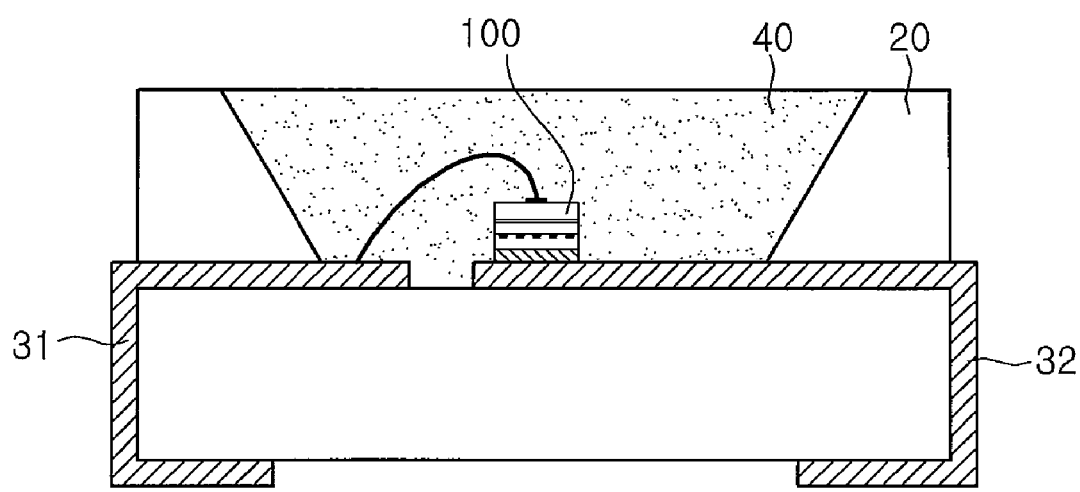
FIG. 8 is a sectional view of a light emitting device package including a light emitting device according to an embodiment.

FIG. 8 is a sectional view of a light emitting device package including a light emitting device according to an embodiment.

Referring to FIG. 8, a light emitting device package according to an embodiment includes a body part 20, first and second electrode layers 31 and 32 disposed on the body part 20, a light emitting device 1 disposed on the body part 20 and electrically connected to the first and second electrode layers 31 and 32, and a molding member 40 surrounding the light emitting device 1.

The body part 20 may be formed of a silicon material, a synthetic resin material, or a metal material. Also, an inclined surface may be disposed around the light emitting device 1.

The first and second electrode layers 31 and 32 are electrically separated from each other to supply power to the light emitting device 1. Also, the first and second electrode layers 31 and 32 may reflect light generated in the light emitting device 100 to increase light efficiency. In addition, the first and second electrode layers 31 and 32 may discharge heat generated in the light emitting device 1 to the outside.

The light emitting device 1 may be disposed on the body part 20 or first or second electrode layer 31 or 32.

Although a wiring method in which the light emitting device 1 is electrically connected to the first and second electrode layers 31 and 32 through a wire is provided, the present disclosure is not limited thereto. For example, the light emitting device 100 may be electrically connected to the first and second electrode layers 31 and 32 through a flip chip method or a die bonding method.

The molding member 40 may surround the light emitting device 1 to protect the light emitting device 100. Also, a phosphor may be contained in the molding member 40 to change a wavelength of the light emitted from the light emitting device 1.

At least one light emitting device according to the above-described embodiments may be mounted on the light emitting device package in one or plurality, but is not limited thereto. The plurality of light emitting device packages according to an embodiment is arrayed on the substrate. Optical members such as a light guide plate, a prism sheet, a diffusion sheet, and a fluorescence sheet may be disposed on a path of the light emitted from the light emitting device packages. The light emitting device packages, the substrate, and the optical members may be functioned as a backlight unit or a lighting system. For example, a lighting system may include the backlight unit, the lighting unit, an indicating device, a lamp, and a street lamp.

Figure 9:
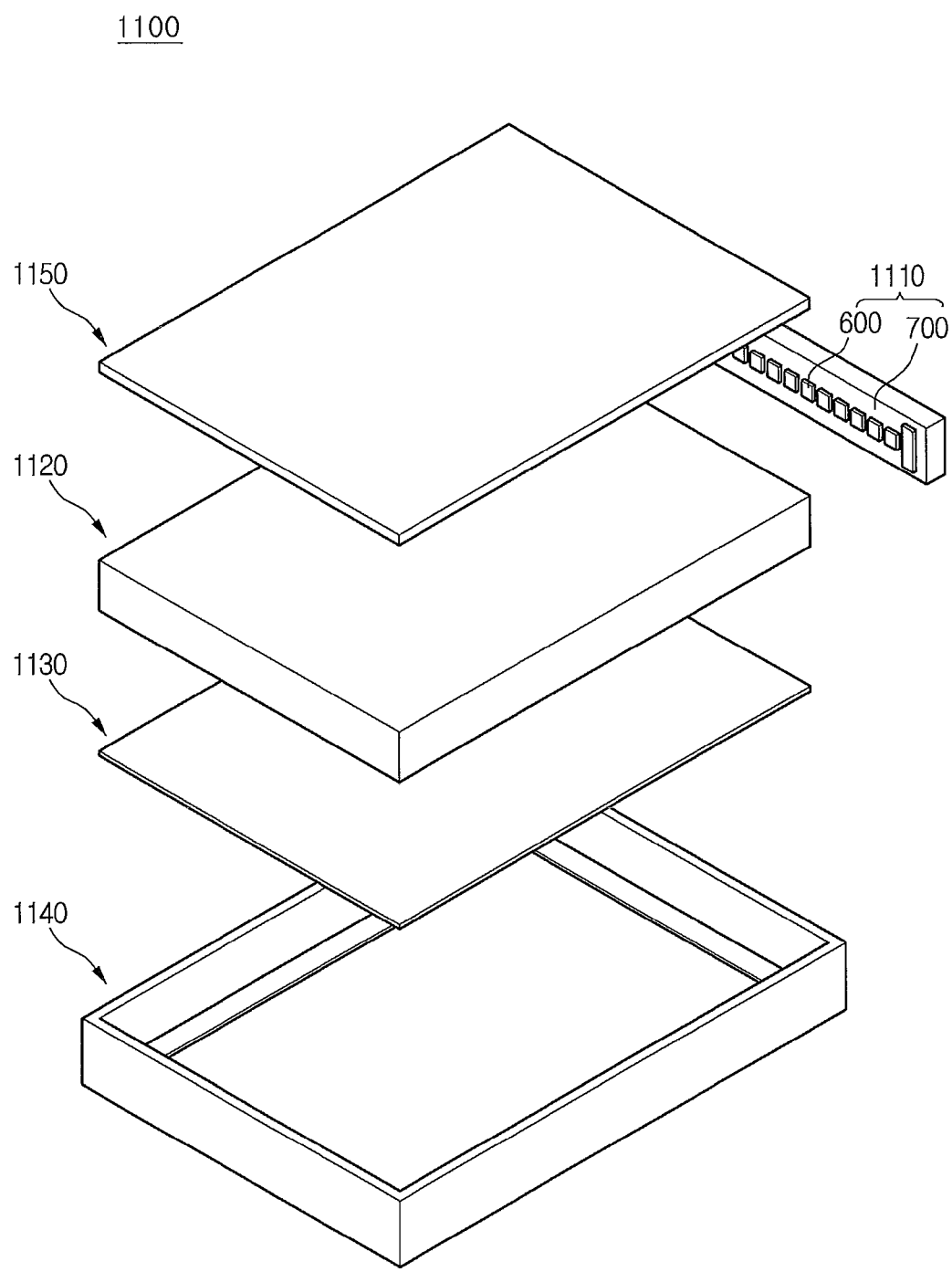
FIG. 9 is an exploded perspective view of a backlight unit including a light emitting device package according to an embodiment.

FIG. 9 is a view of a backlight unit 1100 including a light emitting device package according to an embodiment. However, the backlight unit 1100 of the FIG. 9 is an example of a lighting system, and the present disclosure is not limited thereto.

Referring to FIG. 15, the backlight unit 1100 may include a bottom cover 1140, a light guide member 1120 disposed within the bottom cover 1140, and a light emitting module 1110 disposed on at least one side or an under surface of the light guide member 1120. Also, a reflective sheet 1130 may be disposed below the light guide member 1120.

The bottom cover 1140 may have a box shape with an opened upper side to receive the light guide member 1120, the light emitting module 1110, and the reflective sheet 1130. The bottom cover 1140 may be formed of a metal material or a resin material, but is not limited thereto.

The light emitting module 1110 may include a substrate 700 and a plurality of light emitting device packages 600 mounted on the substrate 700. The plurality of light emitting device packages 600 may provide light to the light guide member 1120. Although the light emitting module 1110 in which the light emitting device package 600 is disposed on the substrate 700 is provided as an example in the present embodiment, the present disclosure is not limited thereto. For example, the light emitting device according to the embodiment may be directly disposed.

As shown in FIG. 15, the light emitting module 1110 may be disposed on at least one of inner surfaces of the bottom cover 1140. Thus, the light emitting module 1110 may provide light toward at least one lateral surface of the light guide member 1120.

The light emitting module 1110 may be disposed below the light guide member 1120 within the bottom cover 1140 to provide light toward an under surface of the light guide member 1120. This may be variously varied according to a design of the backlight unit 1100, and thus, the present disclosure is not limited thereto.

The light guide member 1120 may be disposed within the bottom cover 1140. The light guide member 1120 may receive the light provided from the light emitting module 1110 to produce planar light, thereby guiding the planar light to a display panel (not shown).

For example, the light guide member 1120 may be a light guide panel (LGP). The LGP may be formed of one of a resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

An optical sheet 1150 may be disposed above the light guide member 1120.

For example, the optical sheet 1150 may include at least one of a diffusion sheet, a light collection sheet, a brightness enhancement sheet, and a fluorescence sheet. For example, the diffusion sheet, the light collection sheet, the brightness enhancement sheet, and the fluorescence sheet may be stacked to form the optical sheet 1150. In this case, the diffusion sheet 1150 may uniformly diffuse light emitted from the light emitting module 1110, and the diffused light may be collected into the display panel (not shown) by the light collection sheet. Here, the light emitted from the light collection sheet is randomly polarized light. The bright enhancement sheet may enhance a degree of polarization of the light emitted from the light collection sheet. For example, the light collection sheet may be a horizontal and/or vertical prism sheet. Also, the bright enhancement sheet may be a dual brightness enhancement film. The fluorescence sheet may be a light transmitting plate or film including a phosphor.

The reflective sheet 1130 may be disposed below the light guide member 1120. The reflective sheet 1130 reflects the light emitted through the under surface of the light guide member 1120 toward a light emitting surface of the light guide member 1120.

The reflective sheet 1130 may be formed of a material having superior reflectance, e.g., a PET resin, a PC resin, or a PVC resin, but is not limited thereto.

Figure 10:
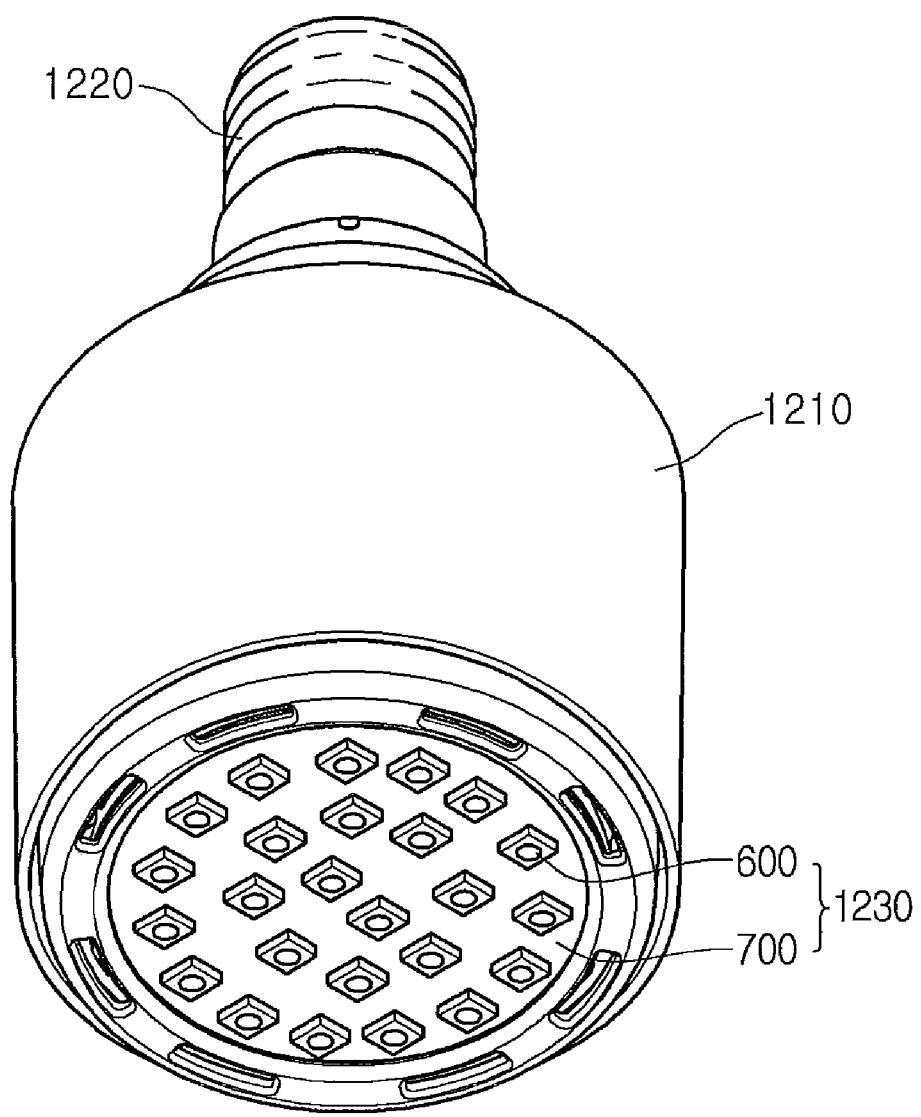
FIG. 10 is a perspective view of a lighting unit including a light emitting device package according to an embodiment.

FIG. 10 is a view of a lighting unit including a light emitting device package according to an embodiment. However, the lighting unit 1200 of FIG. 10 is an example of a lighting system, and thus, the present disclosure is not limited thereto.

Referring to FIG. 10, the lighting system 1200 may include a case body 1210, a light emitting module 1230 disposed on the case body 1210, a connection terminal 1220 disposed on the case body 1210 to receive power from an external power source.

The case body 1210 may be formed of a material having good thermal dissipation properties, e.g., a metal material or a resin material.

The light emitting module 1230 may include a substrate 700 and at least one light emitting device package 600 mounted on the substrate 700. Although the light emitting module 1110 in which the light emitting device package 600 is disposed on the substrate 700 is provided as an example in the present embodiment, the present disclosure is not limited thereto. For example, the light emitting device 100 according to the embodiment may be directly disposed.

A circuit pattern may be printed on a dielectric to form the substrate 700. For example, the substrate 700 may include a printed circuit board (PCB), a metal core PCB, a flexible PCB, and a ceramic PCB.

Also, the substrate 700 may be formed of an effectively reflective material or have a color on which light is effectively reflected from a surface thereof, e.g., a white color or a silver color.

At least one light emitting device package 600 may be mounted on the substrate 700. The light emitting device package 600 may include at least one light emitting diode (LED). The LED may include colored LEDs, which respectively emit light having a red color, a green color, a blue color, and a white color and an ultraviolet (UV) LED emitting UV rays.

The light emitting module 1230 may have various combinations of the LED to obtain color impression and brightness. For example, the white LED, the red LED, and the green LED may be combined with each other to secure a high color rendering index. Also, a fluorescence sheet may be further disposed on a path of light emitted from the light emitting module 1230. The fluorescence sheet changes a wavelength of the light emitted from the light emitting module 1230. For example, when the light emitted from the light emitting module 1230 has a blue wavelength band, the fluorescence sheet may include a yellow phosphor. Thus, the light emitted from the light emitting module 1230 passes through the fluorescence sheet to finally emit white light.

The connection terminal 1220 may be electrically connected to the light emitting module 1230 to provide a power to the light emitting module 1230. Referring to FIG. 16, the connected terminal 1220 is screw-coupled to an external power source in a socket manner, but is not limited thereto. For example, the connection terminal 1220 may have a pin shape, and thus, be inserted into the external power source. Alternatively, the connection terminal 1220 may be connected to the external power source by a wire.

As described above, in the lighting system, at least one of the light guide member, the diffusion sheet, the light collection sheet, the brightness enhancement sheet, and the fluorescence sheet may be disposed on the path of the light emitted from the light emitting module to obtain a desired optical effect.

As described above, the lighting system according to the present embodiment may have the good current spreading effect and include the light emitting device in which the light emitting structure and the second electrode are firmly fixed and coupled to each other and the light emitting device package, thereby having superior light characteristics.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure comprising a first conductive type semiconductor layer, an active layer on the first conductive type semiconductor layer, and a second conductive type semiconductor layer on the active layer;
   a first electrode on the first conductive type semiconductor layer, the first electrode being electrically connected to the first conductive type semiconductor layer;
   a plurality of reflective islands on the second conductive type semiconductor layer;
   a second electrode on the second conductive type semiconductor layer and the plurality of reflective islands, the second electrode being electrically connected to the second conductive type semiconductor layer; and a conductive support member on the second electrode,
wherein each of the plurality of reflective islands is formed of a material different from that of the light emitting structure, and
wherein each of the plurality of reflective islands is formed of metal nitride.

2. The light emitting device of claim 1, wherein the plurality of reflective islands protrudes toward the conductive support member.

3. The light emitting device of claim 2, wherein each of the plurality of reflective islands has a convex lens shape facing the conductive support member.

4. The light emitting device of claim 1, wherein the second electrode contains a metal, and the plurality of reflective islands protrudes toward the inside of the second electrode.

5. The light emitting device of claim 4, wherein each of the plurality of reflective islands has a lens shape convex toward the inside of the second electrode.

6. The light emitting device of claim 1, wherein the second electrode is formed of at least one of silver (Ag), an alloy containing Ag, aluminum (Al), an alloy containing Al, platinum (Pt), and an alloy containing Pt.

7. The light emitting device of claim 1, wherein each of the plurality of reflective islands has a diameter of about 10 nm to about 1,000 nm.

8. The light emitting device of claim 1, comprising each of the plurality of reflective islands is formed by nitrifying a metal island.

9. The light emitting device of claim 1, wherein the plurality of reflective islands is formed of one of InAlGaN, GaN, AlGaN, AlInN, InGaN, AlN, and InN.

10. The light emitting device of claim 1, wherein each of the plurality of reflective islands is formed of a material having a refractive index less than that of the light emitting structure.

11. The light emitting device of claim 10, wherein the second conductive type semiconductor layer is formed of GaN, and each of the plurality of reflective islands is formed of at least one of AlN and AlInN.

12. The light emitting device of claim 1, wherein the plurality of reflective islands has curvatures different from each other.

13. The light emitting device of claim 1, wherein the plurality of reflective islands has diameters different from each other.

14. The light emitting device of claim 1, wherein the conductive support member is formed of at least one of Ti, Cr, Ni, Al, Pt, Au, W, Cu, and Mo, or comprises a semiconductor substrate in which impurities are injected.

15. A light emitting device package comprising:
a body part;
first and second electrode layers on the body part; and
a light emitting device on the body part, the light emitting device being electrically connected to the first and second electrode layers,
wherein the light emitting device comprises:
a light emitting structure comprising a first conductive type semiconductor layer, an active layer on the first conductive type semiconductor layer, and a second conductive type semiconductor layer on the active layer;
a first electrode on the first conductive type semiconductor layer, the first electrode being electrically connected to the first conductive type semiconductor layer;
a plurality of reflective islands on the second conductive type semiconductor layer;
a second electrode on the second conductive type semiconductor layer and the plurality of reflective islands, the second electrode being electrically connected to the second conductive type semiconductor layer; and
a conductive support member on the second electrode,
wherein each of the plurality of reflective islands is formed of a material different from that of the light emitting structure, and
wherein each of the plurality of reflective islands is formed of metal nitride.

16. The light emitting device package of claim 15, wherein the plurality of reflective islands protrudes toward the conductive support member.

17. The light emitting device package of claim 15, wherein the second electrode contains a metal, and the plurality of reflective islands protrudes toward the inside of the second electrode.

18. The light emitting device package of claim 15, wherein the conductive support member is formed of at least one of Ti, Cr, Ni, Al, Pt, Au, W, Cu, and Mo, or comprises a semiconductor substrate in which impurities are injected.

19. The light emitting device package of claim 15, wherein the plurality of reflective islands is formed of one of InAlGaN, GaN, AlGaN, AlInN, InGaN, AlN, and InN.

20. The light emitting device package of claim 15, wherein each of the plurality of reflective islands is formed of a material having a refractive index less than that of the light emitting structure.

* * * * *